(12) United States Patent
Koburger, III et al.

(10) Patent No.: US 8,928,091 B2
(45) Date of Patent: Jan. 6, 2015

(54) FIELD-EFFECT-TRANSISTOR WITH SELF-ALIGNED DIFFUSION CONTACT

(71) Applicant: International Business Machines Corporation, Armonk, NY (US)

(72) Inventors: Charles W. Koburger, III, Delmar, NY (US); Douglas C. LaTulipe, Jr., Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/096,156

(22) Filed: Dec. 4, 2013

(65) Prior Publication Data

US 2014/0091391 A1  Apr. 3, 2014

Related U.S. Application Data

(62) Division of application No. 13/542,003, filed on Jul. 5, 2012, now Pat. No. 8,637,358.

(51) Int. Cl.
*H01L 27/088* (2006.01)
*H01L 27/12* (2006.01)
*H01L 21/84* (2006.01)

(52) U.S. Cl.
CPC .......... *H01L 27/1211* (2013.01); *H01L 21/845* (2013.01)
USPC .. 257/390; 257/192; 257/E27.06; 257/E21.09

(58) Field of Classification Search
USPC .......... 257/192, 390; 438/157, 151, 300, 303, 438/183, 298, 197
See application file for complete search history.

(56) References Cited

U.S. PATENT DOCUMENTS

| | | | |
|---|---|---|---|
| 7,173,305 B2 | 2/2007 | Yang et al. | |
| 7,402,866 B2 | 7/2008 | Liang et al. | |
| 7,648,871 B2 | 1/2010 | Belyansky et al. | |
| 7,666,723 B2 | 2/2010 | Frank et al. | |
| 7,704,838 B2 | 4/2010 | John et al. | |
| 2008/0206977 A1* | 8/2008 | Frank et al. | 438/597 |
| 2010/0044758 A1 | 2/2010 | Cohen et al. | |
| 2011/0169084 A1 | 7/2011 | Yang et al. | |
| 2011/0183508 A1 | 7/2011 | Chan et al. | |
| 2011/0241073 A1 | 10/2011 | Cohen et al. | |

OTHER PUBLICATIONS

2008 IEEE International SOI Conference Proceedings, Upside-Down FETs, D. C. La Tulipe Jr., D. J. Frank, S.E. Steen, A.W. Topol, J. Patel, L. Ramakrishnan, J.W. Sleight, IBM T. J. Watson Research Center, Yorktown Heights, NY, USA.

* cited by examiner

*Primary Examiner* — Mamadou Diallo
(74) *Attorney, Agent, or Firm* — Yuanain Cai

(57) ABSTRACT

Embodiments of the present invention provide an array of fin-type transistors formed on top of an oxide layer. At least a first and a second of the fin-type transistors have their respective source and drain contacts being formed inside the oxide layer, with one of the contacts of the first fin-type transistor being conductively connected to one of the contacts of the second fin-type transistor by an epitaxial silicon layer, wherein the epitaxial silicon layer is formed on top of a first and a second fin of the first and second fin-type transistors respectively.

12 Claims, 10 Drawing Sheets

FIELD-EFFECT-TRANSISTOR WITH SELF-ALIGNED DIFFUSION CONTACT

CROSS-REFERENCE TO RELATED APPLICATION

This is a divisional application of U.S. patent application Ser. No. 13/542,003, filed Jul. 5, 2012.

FIELD OF THE INVENTION

The present invention relates generally to the field of semiconductor device manufacturing and in particular relates to field-effect-transistor with self-aligned diffusion contact and method of forming thereof.

BACKGROUND OF THE INVENTION

With most recent advancement in semiconductor device manufacturing, field-effect-transistors with self-aligned contact-to-diffusion are generally viewed as a necessity for 14-nm node and beyond in order to enable gate pitch scaling with further dense integration of semiconductor devices.

In the meantime, replacement-gate ("gate-last") technologies such as, for example, replacement-metal-gate (RMG) technologies are current front-runners and choice of manufacturing for the 14-nm node. However, replacement-gate technologies tend to be much less amendable to self-aligned contacts ("SAC") because an insulating cap is generally required to be self-aligned atop the conductive gate electrode such that the gate does not get shorted to the self-aligned contact. In addition, etch-back and planarization schemes that are necessary to make the RMG structure generally have small margins of manufacturing.

SUMMARY OF EMBODIMENTS OF THE INVENTION

Embodiments of the present invention provide a method of forming transistors and self-aligned diffusion contact to the transistors. The method includes forming one or more silicon fins on top of an oxide layer, the oxide layer being situated on top of a silicon donor wafer; forming one or more dummy gate electrodes crossing the one or more silicon fins; forming sidewall spacers next to sidewalls of the one or more dummy gate electrodes; removing one or more areas of the oxide layer thereby creating openings therein, the openings being self-aligned to edges of the one or more fins and edges of the sidewall spacers; forming an epitaxial silicon layer in the openings; removing the donor wafer; and siliciding at least a bottom portion of the epitaxial silicon layer.

Embodiments of the method further include forming a dummy dielectric layer covering the one or more silicon fins before forming the one or more dummy gate electrodes crossing the one or more silicon fins.

In one aspect of the embodiments, removing the one or more areas of the oxide layer includes etching the oxide layer not covered by the one or more silicon fins; not covered by the one or more dummy gate electrodes; and not covered by the sidewall spacers next to the dummy gate electrodes; wherein etching the oxide is selective to the dummy dielectric layer and selective to the sidewall spacers.

In another aspect of the embodiments, forming the epitaxial silicon layer further includes forming the epitaxial silicon layer on the one or more silicon fins.

Embodiments of the method further include removing the dummy dielectric layer that covers at least one of the one or more silicon fins before forming the epitaxial silicon layer such that the epitaxial silicon layer conductively connects the at least one of the one or more fins to the silicon donor wafer.

In one aspect of the embodiments, siliciding the at least a portion of the epitaxial silicon layer includes removing the silicon donor wafer to expose the oxide layer and the bottom surface of the epitaxial silicon layer; depositing a layer of silicide-forming metal covering the exposed bottom surface; and converting the bottom portion of the epitaxial silicon layer into silicide.

In another aspect of the embodiments, the epitaxial silicon layer is a first epitaxial silicon layer being confined within the openings inside the oxide layer, further including forming a second epitaxial silicon layer directly on top of the first epitaxial silicon layer as well as covering the one or more silicon fins, wherein the first epitaxial silicon layer is below a top surface of the oxide layer.

Embodiments of the method further include, before forming the second epitaxial silicon layer, removing a dummy dielectric layer covering sidewalls of at least one of the one or more silicon fins such that the second epitaxial silicon layer conductively connects the first epitaxial silicon layer to the at least one of the one or more silicon fins.

Embodiments of the method further include opening a top surface of the one or more dummy gate electrodes; selectively removing material of the dummy gate electrodes thereby creating gate openings; selectively removing portions of a dummy dielectric layer underneath the dummy gate electrodes; the dummy dielectric layer covering the one or more silicon fins; and forming replacement metal gates in the gate openings.

Embodiments of present invention also provide a semiconductor structure, which includes an array of fin-type transistors formed on an oxide layers, at least a first and a second of the fin-type transistors having respective source/drain regions formed inside the oxide layer and being conductively connected to each other by an epitaxial silicon layer, the epitaxial silicon layer being formed on top of a first and a second fins of the first and second fin-type transistors respectively.

In one embodiment, the source/drain regions of the first and second fin-type transistors are self-aligned, respectively, to the first and second fins and to their respective gates.

BRIEF DESCRIPTION OF THE DRAWINGS

The present invention will be understood and appreciated more fully from the following detailed description of preferred embodiments, taken in conjunction with the accompanying drawings of which.

Figure 1:
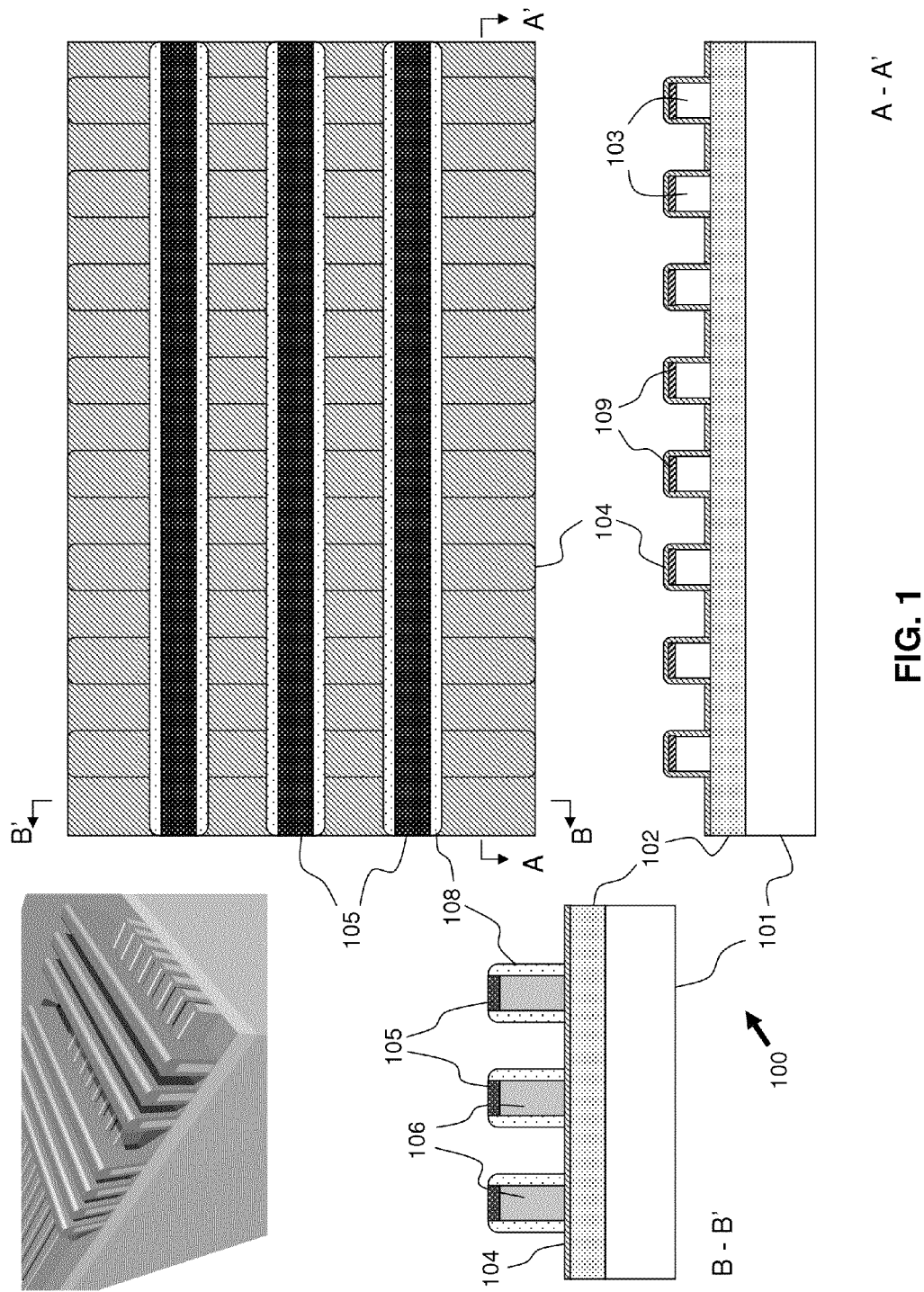
FIG. 1 is a demonstrative illustration of top and cross-sectional views of a semiconductor structure during a process of manufacturing thereof according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of top and cross-sectional views of a semiconductor structure 100 during a process of manufacturing thereof according to an embodiment of present invention. Semiconductor structure 100 may be a part of a large semiconductor chip, for example, and is illustrated to include, among others, one or more three dimensional (3D) or fin-type field-effect-transistors (FETs) that are commonly known to include, for example, FinFETs and tri-gate FETs. For the purpose of description hereinafter without losing generality, it is assumed and demonstratively illustrated that semiconductor structure 100 includes one or more FinFETs (or FinFET transistors), although below description may be equally applied to tri-gate FETs with little or no modification. According to an embodiment of present invention, the FinFETs of semiconductor structure 100 are manufactured or formed to have self-aligned contacts to their source/drain regions, as will be illustrated more clearly throughout FIGS. 1-10 at various stages of manufacturing.

FIG. 1 includes top view of semiconductor structure 100 as well as cross-sectional views taken, when viewing into the paper, at horizontal cross-section denoted by A-A' and vertical cross-section denoted by B-B'. For better understanding and further comprehension, FIG. 1 additionally includes a perspective view of semiconductor structure 100 although references and related description, in the below detailed description of embodiments, will be made only to the top and cross-sectional views of the structure. For the same intended purpose, other figures throughout this application may sometimes include perspective views of semiconductor structure 100 as well.

To manufacture semiconductor structure 100 having one or more fin-type FETs, such as an array of FinFET transistors, one embodiment of a method of present invention may include starting with a silicon-on-insulator (SOI) substrate which is ready made or commercially available. The SOI substrate may include a silicon (Si) wafer 101, known as a "donor" wafer; a silicon-dioxide ($SiO_2$) layer 102, known as a BOX layer or oxide layer, on top of silicon donor wafer 101; and a single-crystal silicon layer, known as a SOI layer, which may be bonded to the BOX layer 102. The method further includes forming the SOI layer into silicon fins 103 as being demonstratively illustrated in FIG. 1.

To form silicon fins 103 from the SOI layer, an etch-stop capping layer may first be formed onto the SOI layer through, for example, deposition. The etch-stop capping layer, in one embodiment, may be made of silicon-nitride ($Si_3N_4$) although other material suitable in providing etch-stop function may be used as well. One or more silicon fins 103 may be subsequently formed or etched out of the SOI layer to be on top of oxide layer 102 through a process involving masking, using industry-standard lithographic techniques, and directionally etching the etch-stop capping layer and underneath SOI layer. The directional etching process, for example a reactive-ion-etching (RIE) process, stops on BOX layer 102. After the RIE etching process, the photo-resist mask used in the lithographic etching process may be removed, leaving patterns of silicon fins 103 and caps 109, which is made of the etch-stop capping layer and is self-aligned to silicon fins 103, on top of BOX layer 102. As being demonstratively illustrated in FIG. 1, after forming silicon fins 103, one embodiment of the method includes forming a gate dielectric layer 104 covering silicon fins 103 and caps 109.

Next, on top of and crossing fins 103 (and on top of gate dielectric layer 104), one or more gate electrodes 106 may be formed. In one embodiment of present invention, gate dielectric layer 104 may be dummy gate dielectric layer and gate electrodes 106 may be dummy gate electrodes since they may be removed and/or replaced later in process according to the replacement-gate technologies. In order to facilitate the replacement-gate process, dummy gate dielectric layer 104 may preferably be made of hafnium-silicon-nitride-oxide ($HfSiO_xN_y$) and dummy gate electrodes 106 may preferably be made of polycrystalline or amorphous silicon (Si). However, embodiments of present invention are not limited in this respect and other suitable materials may be used for the dummy gate dielectric layer and dummy gate electrodes.

Formation of gate electrodes 106 may be achieved by depositing a layer of material suitable for dummy gate electrode onto dummy gate dielectric layer 104, planarizing the dummy gate electrode material by, for example, a chemical-mechanic-polishing (CMP) process, and then depositing a silicon-nitride ($Si_3N_4$) capping layer on top of the dummy gate electrode material. The stack of capping layer and gate electrode material is then patterned by employing standard lithographic and etching processes, to form dummy gate electrodes 106 with self-aligned caps 105 on top thereof. Following the formation of dummy gate electrodes 106, gate sidewall spacers 108 may be formed that cover sidewalls of dummy gate electrodes 106. According to one embodiment, material of dummy gate dielectric layer 104 and sidewall spacers 108 may be made different from that of oxide layer 102, such as made from silicon-nitride ($Si_3N_4$), so as to facilitate a later selective etching process which is described below in more details with reference to FIG. 4.

Figure 2:
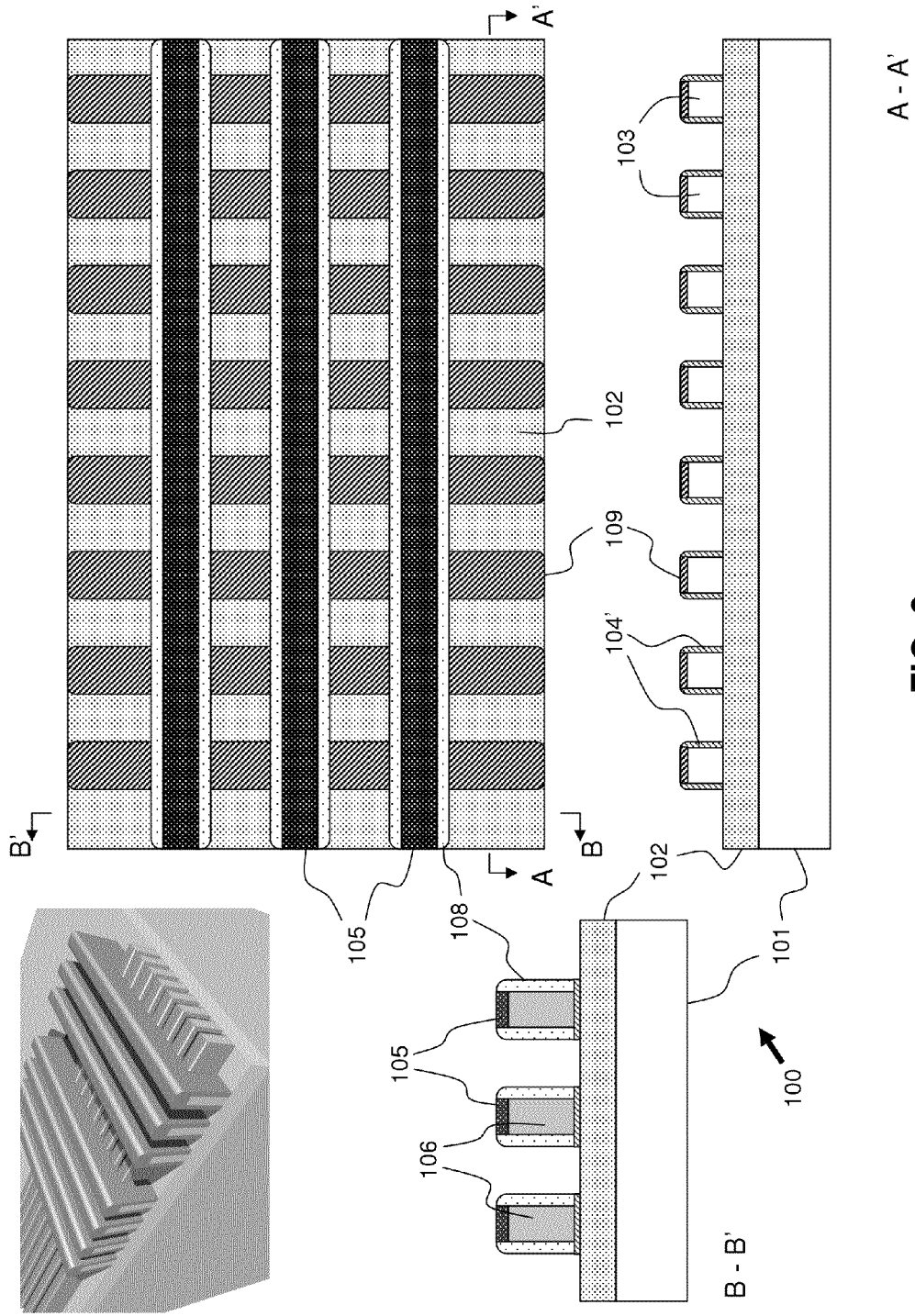
FIG. 2 is a demonstrative illustration of top and cross-sectional views of a semiconductor structure during a process of manufacturing thereof, following the step shown in FIG. 1, according to an embodiment of the present invention.

FIG. 2 is a demonstrative illustration of top and cross-sectional views of semiconductor structure 100 during a process of manufacturing thereof, following the step shown in FIG. 1, according to an embodiment of the present invention. After patterning of dummy gate electrodes 106 and sidewall spacers 108 thereof, portions of dummy gate dielectric layer 104 that are not covered by dummy gate electrodes 106, therefore exposed, are removed by applying a directional device processing technique. For example, one embodiment of the method may include implanting heavy ions such as argon (Ar) or Xenon (Xe), vertically from the top, into the horizontal portions of dummy dielectric layer 104. The ion-implanted portions of dummy dielectric layer 104 are thus "damaged" and subsequently etched away in a wet etching process in hydrofluoric acid (HF). Silicon fins 103 are now protected on top by caps 109 and on their sides by vertically-oriented remaining portions of dummy gate dielectric 104'.

Figure 3:
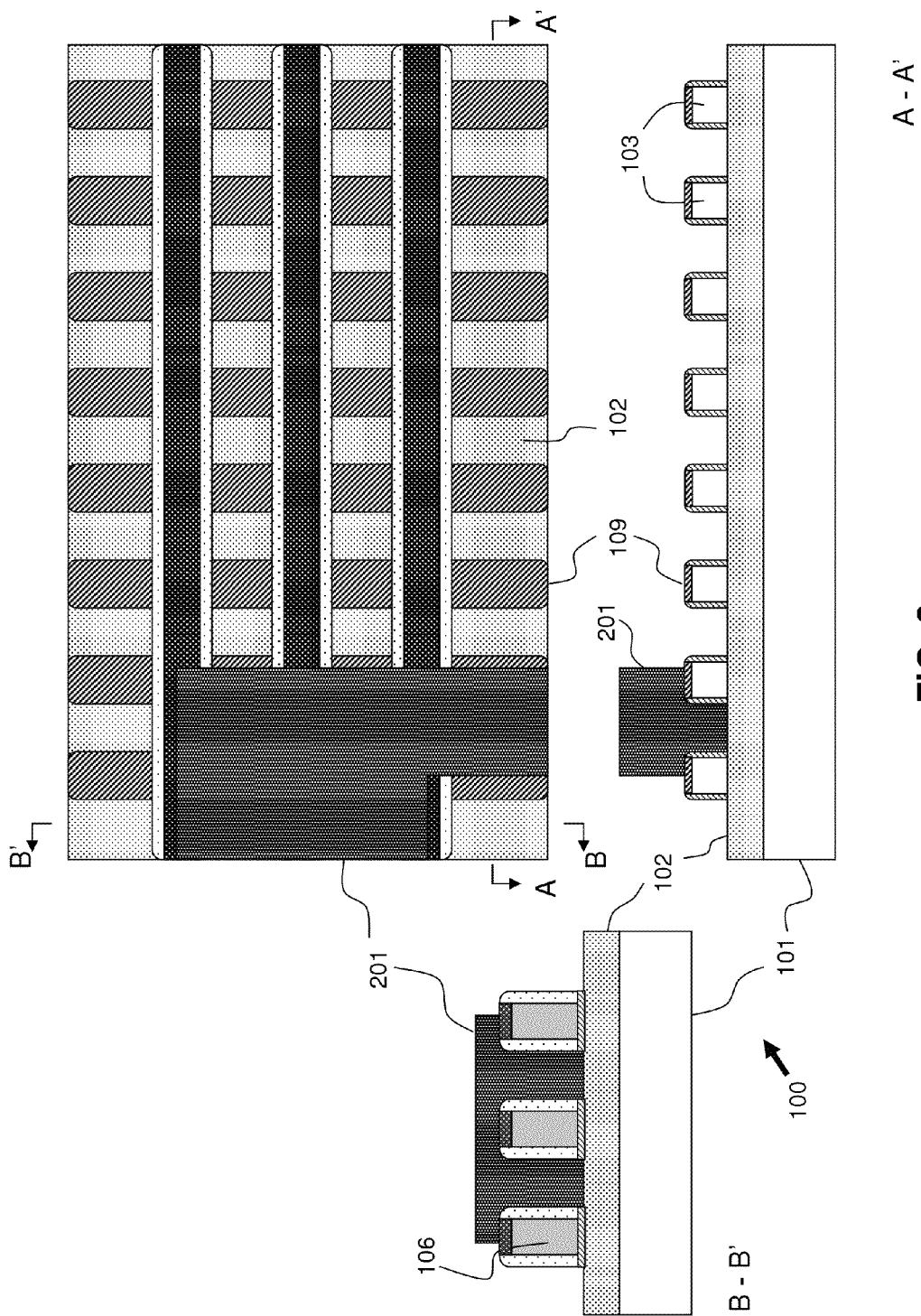
FIG. 3 is a demonstrative illustration of top and cross-sectional views of a semiconductor structure during a process of manufacturing thereof, following the step shown in FIG. 2, according to an embodiment of the present invention.

FIG. 3 is a demonstrative illustration of top and cross-sectional views of semiconductor structure 100 during a process of manufacturing thereof, following the step shown in FIG. 2, according to an embodiment of the present invention. Following the formation of gate stacks 106 as shown in FIG. 2, one embodiment of the method defines diffusion contact areas or regions through a patterning process such as a standard photolithographic patterning process. More specifically, the method includes applying a layer of photo-resist material through, for example, a spin-on process to cover top surface of semiconductor structure 100 including covering fins 103 and gate stacks 106. The method subsequently exposes the photo-resist material to a pre-determined pattern to form a photo-resist mask 201, which covers a portion or portions of the underneath semiconductor structure 100, leaving areas that are subject to forming diffusion contacts exposed. Here, it is to be noted that a person skilled in the art will appreciate that embodiment of present invention is not limited in the above aspect and other types of masks, such as a hard mask, may be used as well to cover semiconductor structure 100.

Figure 4:
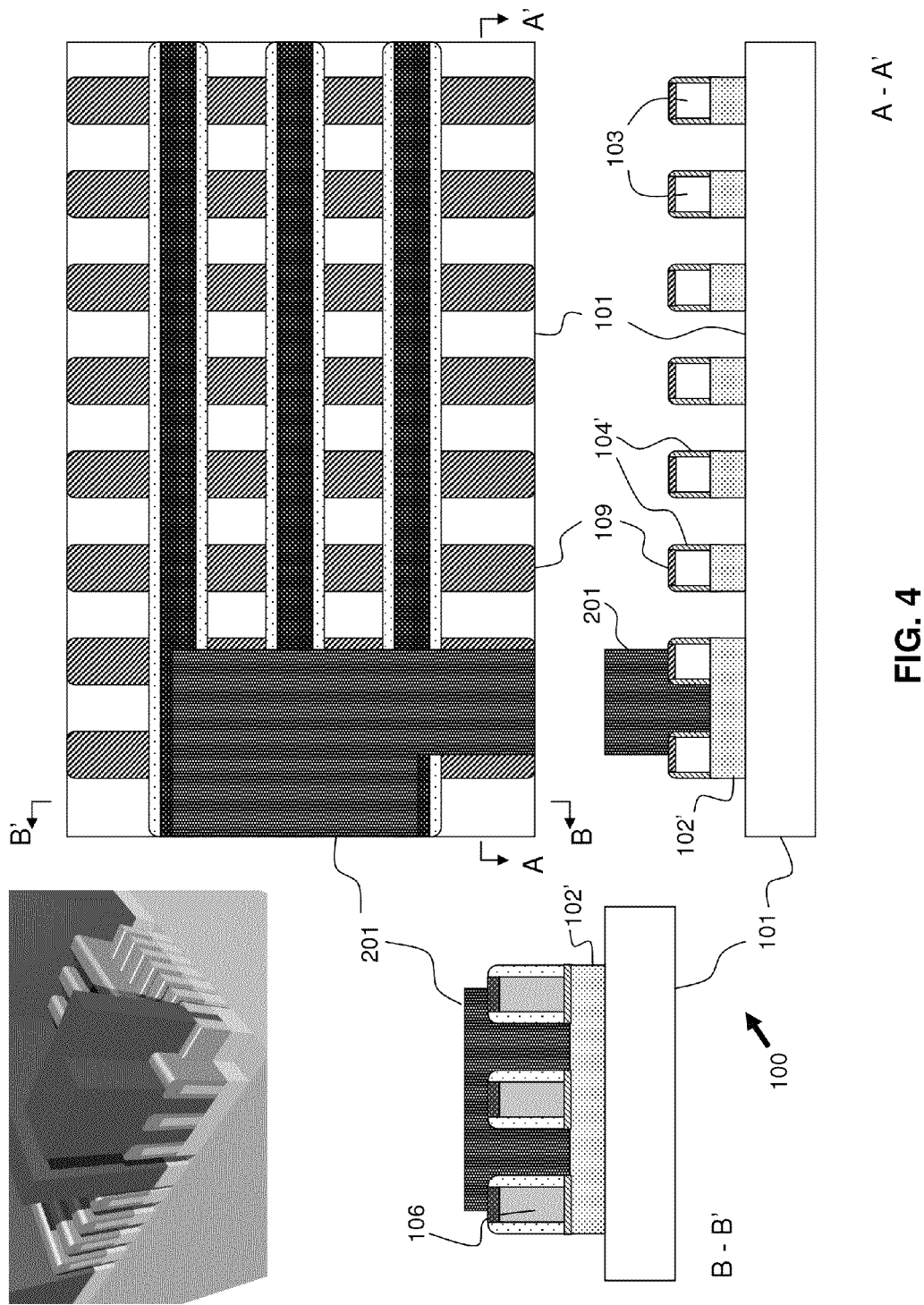
FIG. 4 is a demonstrative illustration of top and cross-sectional views of a semiconductor structure during a process of manufacturing thereof, following the step shown in FIG. 3, according to an embodiment of the present invention.

FIG. 4 is a demonstrative illustration of top and cross-sectional views of semiconductor structure 100 during a process of manufacturing thereof, following the step shown in FIG. 3, according to an embodiment of the present invention. More specifically, with photo-resist mask 201 covering portions or parts of semiconductor structure 100, one embodiment of the method includes performing a directional etching process, such as a reactive-ion-etching (RIE) process, to remove parts of oxide layer 102 that are neither covered by fins 103 and vertically-oriented gate dielectric layer 104' next to fins 103, nor by gate stacks 106 and sidewall spacers 108, nor by photo-resist mask 201. The RIE process may be made or adjusted to be selective to caps 105 and 109, to sidewall spacers 108, and to gate dielectric layer 104'. The removal of uncovered oxide layer 102 creates openings that are self-aligned to fins 103 and dummy dielectric layer 104', and to sidewall spacers 108 of gate stacks 106, and exposes underneath silicon donor wafer 101. In other words, the etching process defines areas where openings are formed and where diffusion contacts may be formed.

Figure 5:
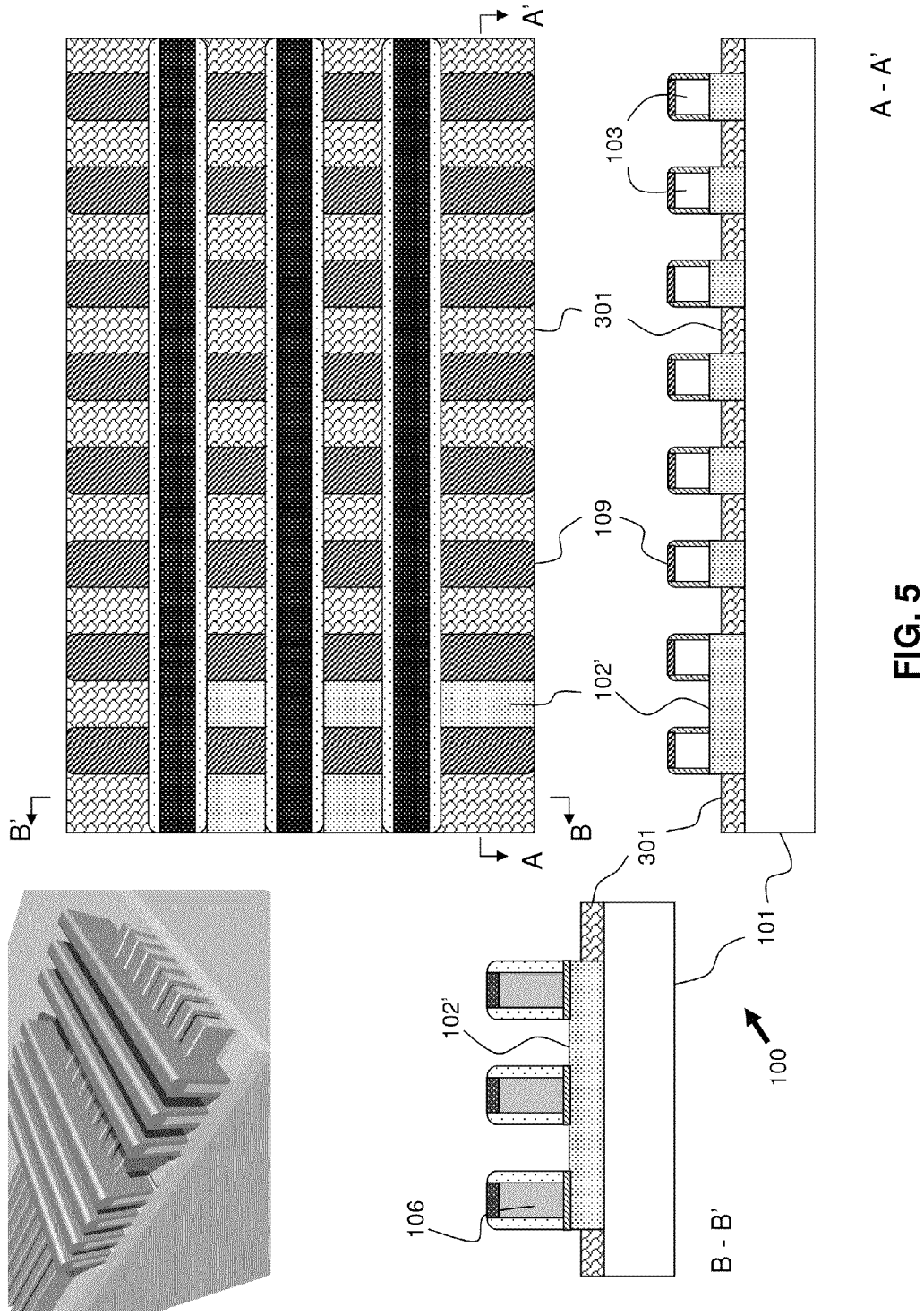
FIG. 5 is a demonstrative illustration of top and cross-sectional views of a semiconductor structure during a process of manufacturing thereof, following the step shown in FIG. 4, according to an embodiment of the present invention.

FIG. 5 is a demonstrative illustration of top and cross-sectional views of semiconductor structure 100 during a process of manufacturing thereof, following the step shown in FIG. 4, according to an embodiment of the present invention. For example, following the removal process of exposed portions of oxide layer 102, photo-resist mask 201 may be stripped off or removed to expose the underneath remaining oxide layer 102'. One embodiment of the method may include optionally performing a pre-epitaxial cleaning to remove any contaminating or foreign objects and/or particles that may possibly remain at the top surface of silicon donor wafer 101. After the optional cleaning, doped silicon layer 301 may be selectively and epitaxially formed in the previously formed openings in the oxide layer 102. For example, epitaxial silicon layer 301 may be doped with boron (B) or arsenic (As) in order to provide appropriate (high) conductivity. Epitaxial silicon layer 301 may only form in areas where silicon donor wafer 101 is exposed. In other words, epitaxial silicon layer 301 may not form or at least may not substantially form in areas where donor wafer 101 is still covered by oxide layer 102', or by fins 103 or by dummy gate electrodes 106.

Figure 6:
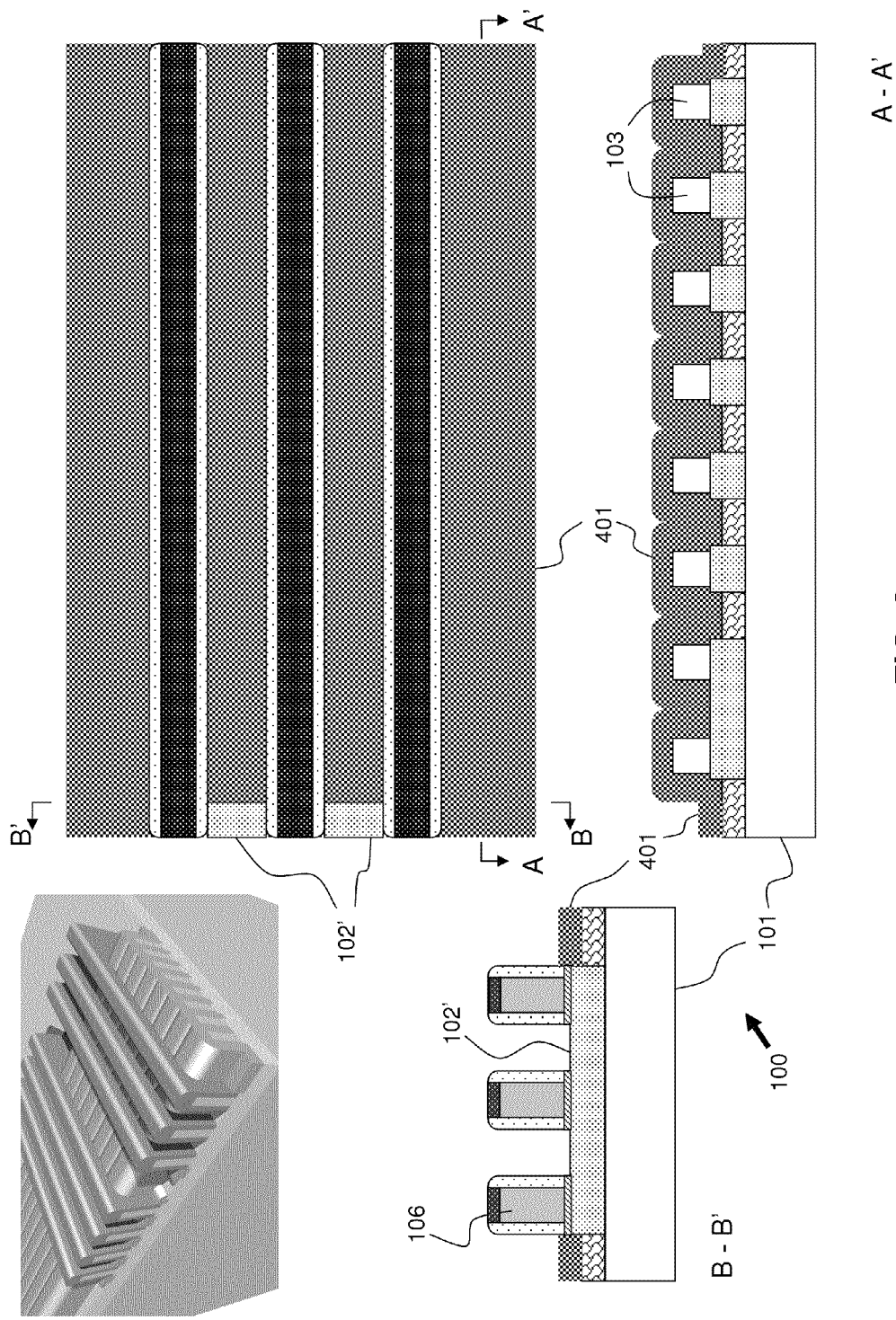
FIG. 6 is a demonstrative illustration of top and cross-sectional views of a semiconductor structure during a process of manufacturing thereof, following the step shown in FIG. 5, according to an embodiment of the present invention.

According to one embodiment, epitaxial layer 301 may be formed sufficiently thick such that a subsequently formed source/drain epitaxial layer, as is shown in FIG. 6, may bridge epitaxial layer 301 to an epitaxial film simultaneously grown onto fins 103 for embodiments where dummy gate dielectric 104' is completely removed from exposed portions of fins 103. According to yet another embodiment, epitaxial layer 301 may be formed yet thin enough so as not to be in contact with fins 103, through for example sidewalls of fins 103. This embodiment is enabled by the existence of caps 109 and leaving dummy gate dielectric 104' on the sidewalls of fins 103 to prevent nucleation of epi on those areas. For example, epitaxial layer 301 may be formed to have a height slightly lower than a top surface of oxide layer 102. According to yet another embodiment, the formation of epitaxial layer 301 may be optional for Ultra-Thin Body and Box (UTBB) device and/or other similar situations where oxide layer 102 is sufficiently thin. In this situation, a later formed source/drain epitaxial layer may be directly contacted by any back-side formed contact structure.

FIG. 6 is a demonstrative illustration of top and cross-sectional views of semiconductor structure 100 during a process of manufacturing thereof, following the step shown in FIG. 5, according to an embodiment of the present invention. For example, one embodiment of the method includes selectively removing portions of dummy gate dielectric 104' at the fin-sidewalls as well as fin caps 109 that cover at least one of the fins 103, and then growing a doped, or un-doped, epitaxial silicon layer 401 to cover fins 103 as well as areas where oxide layer 102 had been removed. For example, epitaxial silicon layer 401 may be formed directly on top of exposed silicon donor wafer 101 or, in the case where epitaxial silicon layer 301 was optionally formed there, formed directly on top of epitaxial silicon layer 301. As a result, epitaxial silicon layer 401 conductively connects epitaxial silicon layer 301 (or silicon donor wafer 101) to fins 103, which are now exposed following the removal of portions of dummy gate dielectric 104' at sidewalls of fins 103, and/or the removal of caps 109. In one embodiment, dummy gate dielectric 104' and caps 109 may be left around or on top of fins 103, which effectively insulate fins 103 from epitaxial silicon layer 401. Epitaxial silicon layer 401 may connect to other areas of epitaxial silicon layer 301 or other exposed silicon donor wafer 101.

In areas where oxide layer 102 was not removed, epitaxial silicon layer 401 may or may not form depending upon space constraints between two neighboring fins 103. For example, in a space wherein two neighboring fins 103 are closely placed epitaxial layer 401 may actually fill in the space because of the epitaxial formation from sidewalls of the fins even though epitaxial layer 401 does not form bottom-up from the underneath oxide layer 102. On the other hand, in some areas part of oxide layer 102 may still be exposed and epitaxial layer 401 may not fill completely to cover the oxide layer 102. Nevertheless, both situations are acceptable because epitaxial layer 401 will not be visible and not be exposed, in areas where oxide layer 102 remains, when viewing from the bottom of the silicon donor wafer 101.

Figure 7:
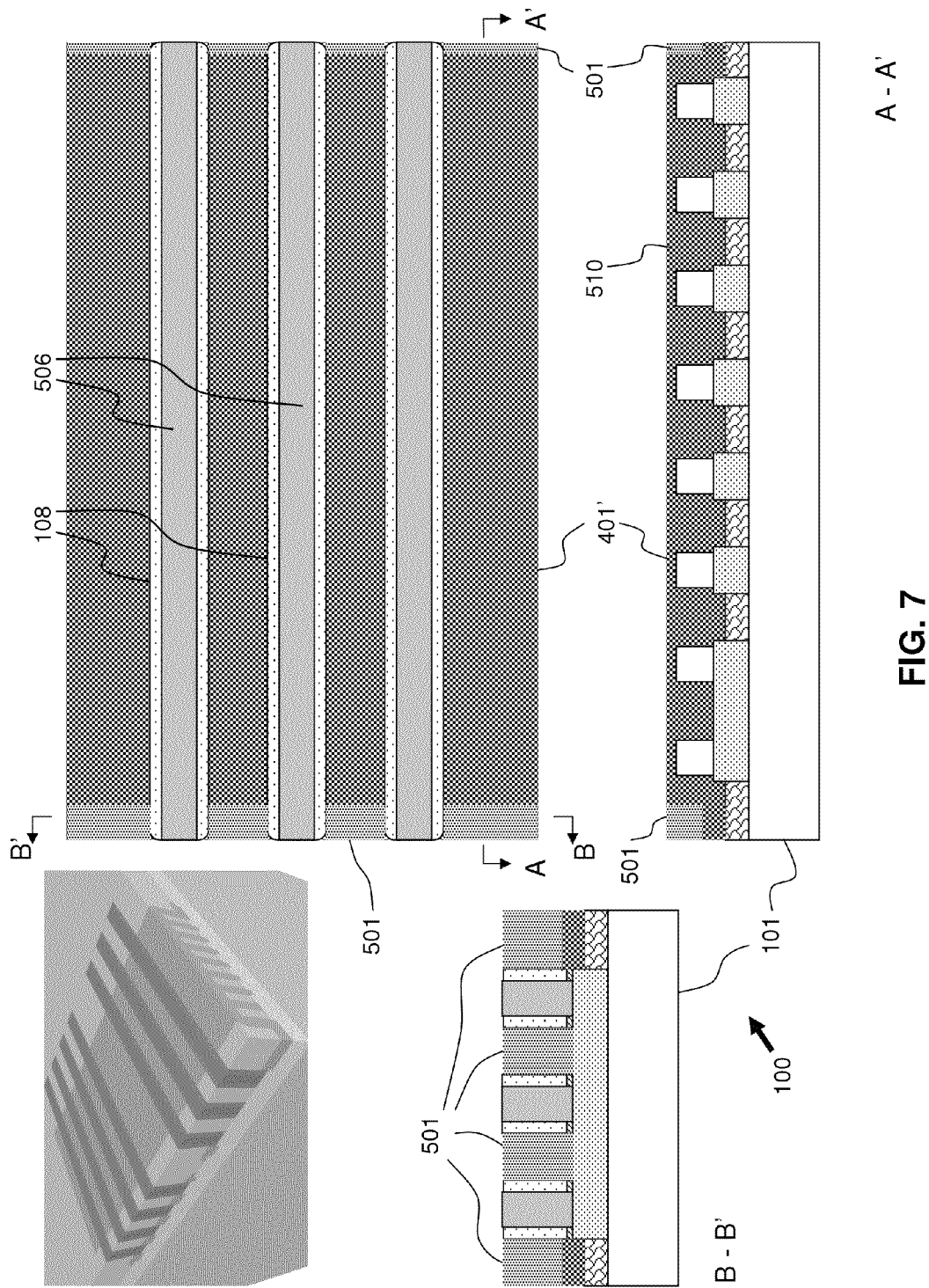
FIG. 7 is a demonstrative illustration of top and cross-sectional views of a semiconductor structure during a process of manufacturing thereof, following the step shown in FIG. 6, according to an embodiment of the present invention.

FIG. 7 is a demonstrative illustration of top and cross-sectional views of semiconductor structure 100 during a process of manufacturing thereof, following the step shown in FIG. 6, according to an embodiment of the present invention. For example, one embodiment of the method includes preparing for a replacement-gate process. More specifically, the method includes applying a Pre-Metal Dielectric (PMD) layer 501 to blanket cover the top surface of semiconductor structure 100 by filling in gaps, such as areas between gate electrodes and filling in spaces between neighboring fins that are not completely filled up by epitaxial silicon layer 401. The method then follows with applying a planarization process, such as a chemical-mechanic-polishing (CMP) process, to create a planar surface 510 as well as open up dummy gate electrodes 106 by removing or polishing off caps 105 on top of dummy gate electrodes 106. Once the top portions of dummy gate electrodes 106 are exposed, material of dummy gate electrodes 106 is removed through a selective etching process to expose underneath dummy gate dielectric 104', in the replacement gate region, that is still covering fins 103. Here, it is noted that outside the replacement gate region dummy gate dielectric layer 104' has already been removed before epitaxial layer 401 is formed, as being illustrated in FIG. 6. The dummy gate dielectric layer 104' in the replacement gate region is then removed as well through another selective etching process. According to one embodiment, the method then deposits a new gate dielectric layer (not shown) of, for example, a combination of very thin $SiO_2$ and $HfO_2$ onto the exposed silicon fins 103 within the gate region, and fills in the opened gate region with a new gate electrode material 506. The new gate electrode material 506 may include, for example, TiN or other metallic layers such as tungsten or aluminum for improved conductivity. The new gate electrode material may be deposited into the openings, and excess of that may be removed through a follow-up CMP process.

Figure 8:
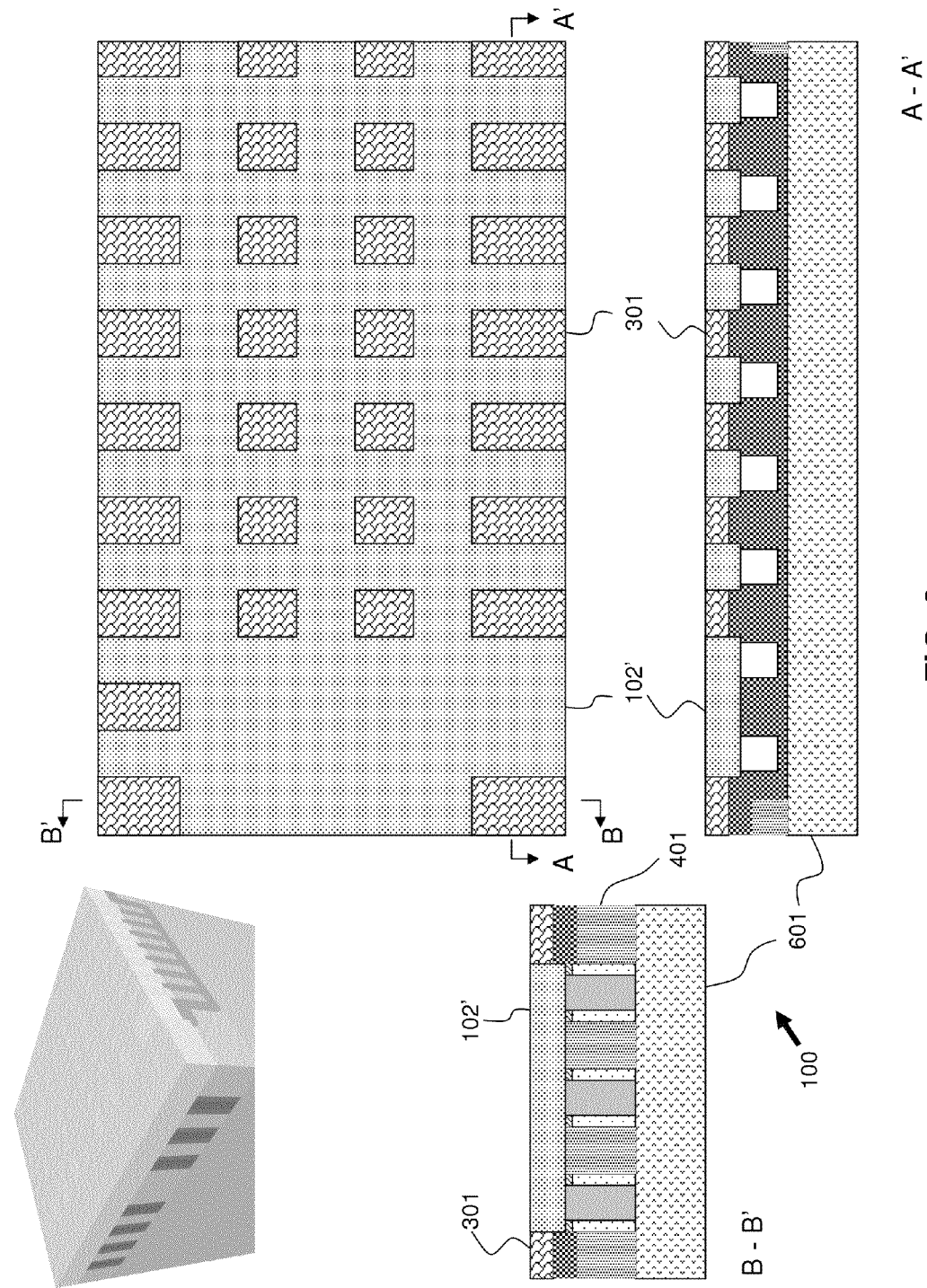
FIG. 8 is a demonstrative illustration of top and cross-sectional views of a semiconductor structure during a process of manufacturing thereof, following the step shown in FIG. 7, according to an embodiment of the present invention.

FIG. 8 is a demonstrative illustration of top and cross-sectional views of semiconductor structure 100 during a process of manufacturing thereof, following the step shown in FIG. 7, according to an embodiment of the present invention. Following the finishing of replacement-gate process, the entire device or semiconductor structure 100 may be flipped upside-down with the gate electrodes 506 and fins 103 situated at the bottom and silicon donor wafer 101 at the top. The device side of the flipped donor wafer 101, including the planarized gate electrodes 506, is then bond assembled, for instance by low temperature oxide fusion bonding or thermally stable adhesive bond processing, to a handle wafer 601. The handle wafer 601 will provide mechanical support for devices 100 after the donor wafer 101 is removed. The handle wafer 601 may be made of a similar or a dissimilar material to the donor wafer 101, and may include for instance silicon, sapphire, silicon carbide.

According to one embodiment of present invention, silicon donor wafer 101, now at the top, is then removed. The removal of silicon donor wafer 101 may be made through, for example, a CMP process or through a combination of mechanical grinding as well as wet or dry etching processes. The removing process of original silicon donor wafer 101 is preferably stopped before any significant erosion of the epitaxial layer 301 happens. In order to accomplish that, according to one embodiment of present invention, an appropriately-doped epitaxial layer 301 may be used which may also work as an etch-stop layer. For example, a boron-doped epitaxial stop layer 301 may provide sufficient etch selectivity when, after preliminary mechanical grinding, remaining portions of the silicon donor wafer 101 are removed in TMAH (Tetramethylammonium hydroxide).

The removal of silicon donor wafer 101 exposes oxide layer 102, which was not etch-removed in a previous step as being illustrated in FIG. 4, as well as epitaxially grown silicon layer 301, which may be doped and is self-aligned to source/drain regions of at least some of the FinFET transistors.

Figure 9:
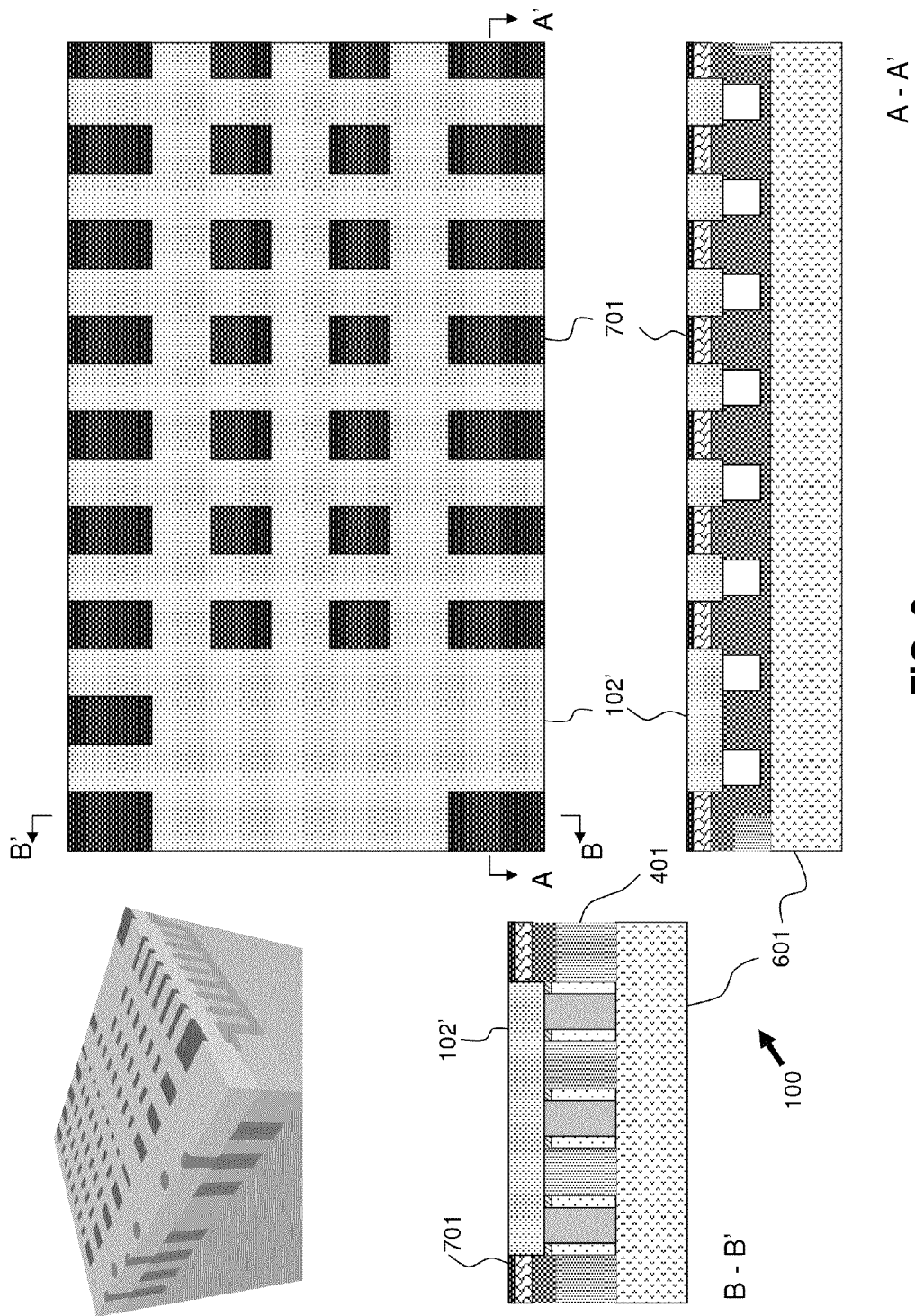
FIG. 9 is a demonstrative illustration of top and cross-sectional views of a semiconductor structure during a process of manufacturing thereof, following the step shown in FIG. 8, according to an embodiment of the present invention.

FIG. 9 is a demonstrative illustration of top and cross-sectional views of semiconductor structure 100 during a process of manufacturing thereof, following the step shown in FIG. 8, according to an embodiment of the present invention. For example, after the original silicon donor wafer 101 is removed and the epitaxial silicon layer 301 being exposed, silicide 701 may be formed at least in the top portion (viewed in the orientation of FIG. 9) of epitaxial silicon layer 301 through known or future developed technique. For example, in order to form silicide 701, a layer of silicide-forming metal, such as titanium (Ti), cobalt (Co), or nickel (Ni), may first be deposited on top of epitaxial layer 301. The deposition may be followed by a rapid thermal annealing (RTA) process which converts at least the top portion of epitaxial layer 301 into silicide 701. Any un-reacted portions of the silicide-forming metal are then selectively removed by wet etching, leaving silicide 701 on exposed portions of epitaxial layer 301. In one embodiment where epitaxial silicon layer 401 was formed directly on top of silicon donor wafer 101, as being described previously with regard to FIG. 6, epitaxial silicon layer 401 is exposed and silicide 701 is formed at a top portion (viewed in the orientation of FIG. 9) of epitaxial silicon layer 401.

Figure 10:
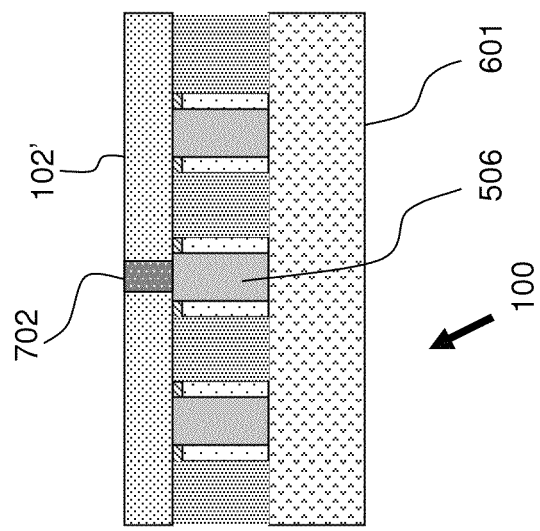
FIG. 10 is a demonstrative illustration of top and cross-sectional views of a semiconductor structure during a process of manufacturing thereof, following the step shown in FIG. 8, according to an embodiment of the present invention.
Figure 10:
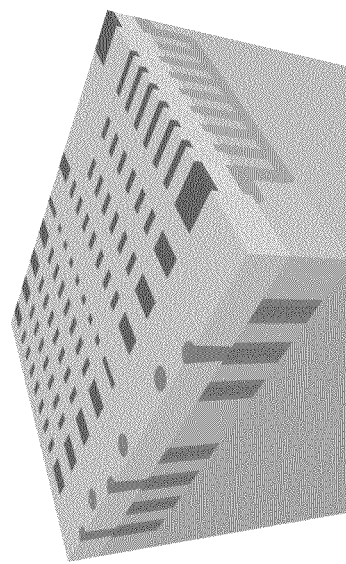

FIG. 10 is a demonstrative illustration of top and cross-sectional views of semiconductor structure 100 during a process of manufacturing thereof, following the step shown in FIG. 8, according to an embodiment of the present invention. For example, one or more contacts 702 to the gate electrode 506 may be formed following the removal of silicon donor wafer 101. The formation of contacts 702 may be performed through a combination of masking and RIE etching processes. For example, a contact masking pattern may first be formed on top of oxide layer 102' and then opening being made through oxide layer 102' in areas where contacts 702 are to be formed to expose underneath gate electrode 506. The openings are then filled with liner metals such as Ti, and contact materials such as tungsten (W) or copper (Cu), and polished to remove any excess above oxide layer 102. Silicide at the top surface of gate electrode (next to contact-to-gate 702) may be optionally formed in order to increase conductivity, depending upon material, structure, and other details of gate electrode 506.

Following the formation of contact-to-gate 702 and silicide 701 (FIG. 9) in epitaxial silicon layer 301 in the source/drain regions, a PMD layer (not shown) may be formed on top of device or semiconductor structure 100 to cover oxide layer 102', silicide 701, and contact-to-gate 702 for further processing. Optionally, contact-to-gate 702 may be formed after the formation of the PMD layer in connection with processes of creating additional vias in the PMD layer. Other standard processing steps may follow.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor structure comprising:
an array of fin-type transistors formed on top of an oxide layer, at least a first and a second of said fin-type transistors having their respective source and drain contacts formed inside openings created in said oxide layer, one of said contacts of said first fin-type transistor being conductively connected to one of said contacts of said second fin-type transistor by an epitaxial silicon layer, said epitaxial silicon layer being formed on top of a first and a second fin of said first and second fin-type transistors respectively.

2. The semiconductor structure of claim 1, wherein said contacts of said first and second fin-type transistors are self-aligned, respectively, to said first and second fins of said first and second fin-type transistors.

3. The semiconductor structure of claim 1, wherein said contacts of said first and second fin-type transistors are self-aligned, respectively, to a first and a second gate of said first and second fin-type transistors.

4. The semiconductor structure of claim 1, wherein said contacts have a silicide bottom surface, said silicide bottom surface being coplanar with a bottom surface of said oxide layer.

5. The semiconductor structure of claim 1, further comprising a contact structure conductively connected to a gate of at least one of said array of fin-type transistors, said contact structure having a conductive path through said oxide layer to be accessible at a bottom surface of said oxide layer.

6. A semiconductor structure comprising:
a plurality of fin-type transistors formed on top of an insulating layer, at least one of said plurality of fin-type transistors having a source contact and a drain contact that are formed inside openings created in said insulating layer and being conductively accessible at a bottom surface of said insulating layer,
wherein at least one of said source contact and said drain contact has a silicide Bottom surface, said silicide bottom surface being coplanar with a bottom surface of Said insulating layer.

7. The semiconductor structure of claim 6, wherein said source contact and drain contact formed inside said insulating layer are self-aligned to a fin of said at least one of said plurality of fin-type transistors, said fin being formed directly on top of said insulating layer.

8. The semiconductor structure of claim 7, wherein said source contact and drain contact formed inside said insulating layer are self-aligned to a gate of said at least one of said plurality of fin-type transistors, said gate being formed on top of said fin in a perpendicular direction.

9. The semiconductor structure of claim 6, wherein said at least one of said plurality of fin-type transistors is a first fin-type transistor, further comprising a second fin-type transistor of said plurality of fin-type transistors, and wherein said first and second fin-type transistors are conductively connected at one of their respective sources and respective drains by a silicon layer, said silicon layer being epitaxially formed on top of a first and a second fin of said first and second fin-type transistors.

10. The semiconductor structure of claim 6, wherein said at least one of said plurality of fin-type transistors has a gate electrode, said gate electrode is conductively accessible through a bottom surface of said insulating layer.

11. The semiconductor structure of claim 10, wherein said gate electrode is conductively connected to a conductive stud formed inside said insulating layer, and said gate electrode is accessible through said conductive stud at said bottom surface of said insulating layer.

12. The semiconductor structure of claim 6, wherein said insulating layer is made of an oxide layer of a silicon-on-insulator (SOI) substrate.

\* \* \* \* \*